United States Patent [19]
Lu

[11] Patent Number: 4,989,057
[45] Date of Patent: Jan. 29, 1991

[54] ESD PROTECTION FOR SOI CIRCUITS

[75] Inventor: Hsindao Lu, Dallas, Tex.

[73] Assignee: Texas Instruments Incorporated, Dallas, Tex.

[21] Appl. No.: 199,217

[22] Filed: May 26, 1988

[51] Int. Cl.$^5$ .................... H01L 27/01; H01L 27/13; H01L 29/78

[52] U.S. Cl. ......................... 357/23.7; 357/23.8; 357/23.13; 357/42; 357/57; 357/59; 307/283

[58] Field of Search .................. 357/23.13, 23.7, 23.8, 357/42, 57, 59 E, 56, 22 I, 22 J, 22 K; 307/274, 283, 322, 324

[56] References Cited

U.S. PATENT DOCUMENTS 4,489,339 12/1984 Uchida .............................. 357/23.7
4,763,183 8/1988 Ng et al. ........................... 357/23.7

FOREIGN PATENT DOCUMENTS 5097736 2/1977 Japan .............................. 357/23.7
62-62561 3/1987 Japan ............................. 357/23.13

OTHER PUBLICATIONS

Schwob, P., SOS Technology, Bull. ASE/UCS 68 (1972) pp. 60–65.
"C-MOS/SOS Gate-Protection Networks", R. K. Pancholy and T. J. Oki, IEEE Transactions on Electron Devices, vol. ED-25, p. 927, 1978.
"An Improved Input Protection Circuit for C-MOS/SOS Arrays", S. H. Cohen and G. K. Caswell, ibid, p. 926.
"C-MOS/SOS LSI Input/Output Protection Networks", B. T. Ahlport, J. R. Cricchi and D. A. Barth, ibid, p. 933.
"Design and Characterization of Input Protection Networks for CMOS/SOS Application", W. Palumbo and M. P. Dugan, EOS/ESD Symposium Proceedings, p. 182, 1986.

Primary Examiner—Andrew J. James
Assistant Examiner—Sara W. Crane
Attorney, Agent, or Firm—James C. Kesterson; James T. Comfort; Melvin Sharp

[57] ABSTRACT

A floating body field effect transistor having a defined breakdown voltage, and a lower holding voltage, serves to clamp electrostatic discharge voltages to a low voltage level, thereby minimizing thermal power dissipation within the thin semiconductor layer of semiconductor-on-insulator circuits.

20 Claims, 1 Drawing Sheet

ESD PROTECTION FOR SOI CIRCUITS

TECHNICAL FIELD OF THE INVENTION

The present invention relates in general to electrostatic discharge protection circuits for integrated circuits, and more particularly relates to fabrication methods and resulting circuit structures for providing electrostatic discharge protection to semiconductor-on-insulator circuits.

BACKGROUND OF THE INVENTION

The semiconductor-on-insulator technology constitutes a new technique for fabricating high-speed MOS and CMOS circuits. According to such a technique, a thin epitaxial layer of semiconductor material, such as silicon, is deposited on an insulator to reduce the capacitive coupling between the semiconductor layer and the underlying insulator and substrate material. Field effect transistors and other devices fabricated within the thin layer of semiconductor material exhibit high-speed switching characteristics.

MOS-type circuits are particularly susceptible to damage by electrostatic discharge. According to current fabrication techniques, the thin gate insulators of MOS and CMOS transistors can be damaged by gate voltages in excess of about seventeen volts. Hence, static discharges by persons or equipment handling such integrated circuits can permanent damage an entire chip. Static discharge destruction of integrated circuits is particularly troublesome, in that electrostatic voltage buildups on a person can reach hundreds to thousands of volts.

While electrostatic discharge (ESD) protection devices have been implemented as ancillary circuits on MOS-type integrated circuit chips, an additional concern arises with semiconductor-on-insulator chips. Traditionally, the energy of an electrostatic discharge was maintained at a safe voltage level by such ancillary protection circuits, and the energy was dissipated in the bulk semiconductor substrate on which the circuits were fabricated. In contrast, with semiconductor-on-insulator SOI) circuits, the thin semiconductor layer has insubstantial bulk to safely, dissipate all the electrostatic energy as thermal energy. Since most electrically insulating materials are poor thermal conductors, substantially all the energy must be dissipated within the thin semiconductor layer which overlies the insulator on SOI chips.

Input protection circuits are well known for use on silicon-on-sapphire (SOS) substrates. The following technical articles are illustrative of the ESD protection circuits adapted for SOI structures: R. K. Pancholy and T. J. Oki, "C-MOS/SOS Gate-Protection Networks", IEEE Trans. on Elec. Dev., Vol. ED-25, pp. 917, 1978; S. H. Cohen and G. K. Caswell, "An Improved Input Protection Circuit for C-MOS/SOS Arrays" ibid, pp. 926; B. T. Ahlport, J. R. Cricchi and D. A. Barth, "C-MOS/SOS LSI Input/Output Protection Networks" ibid, pp. 933; and W. Palumbo and M. P. Dugan, "Design and Characterization of Input Protection Networks for CMOS/SOS Application", EOS/ESD SYMPOSIUM PROCEEDINGS, pp. 182, 1986. Typical of such input protection networks is a gated diode or a p-i-n diode which exhibits a forward threshold of about 0.7 volts and a reverse breakdown voltage of about 14 volts. Thus, the clamping of input gate voltages to less than the requisite 17 volts is achieved. More importantly, the energy developed across such a protection diode when operating at a breakdown voltage of about 14 volts can be substantial. The heat generated by such diodes must be dissipated by the thin semiconducter layer which, if such energy becomes excessive, poses the danger of destruction to the integrated circuit chip.

From the foregoing, it can be seen that a need exists for improved electrostatic discharge protection circuits which can be easily fabricated and which are compatible with other transistors on the chip, as well as provide a lower voltage drop thereacross to thereby reduce the thermal energy dissipation requirements of the thin semiconductor layer of the SOI structure. An associated need exists for an electrostatic discharge protection circuit which can be fabricated according to current silicon processing techniques and equipment.

SUMMARY OF THE INVENTION

In accordance with the invention, there is disclosed an improved electrostatic discharge protection circuit which reduces or substantially eliminates the shortcomings and disadvantages of prior protection circuits. According to the invention, a conventional N-channel ESD transistor is fabricated, but having a conduction channel bulk region which is electrically isolated as an island from the another transistors of the chip. The ESD transistor is configured either in a common gate-drain or gate-source configuration and connected respectively between an input or output pad of the chip and to a ground or supply voltage bonding pad. Such a transistor exhibits an initial breakdown voltage less than that of the gated diode, and a holding voltage which significantly reduces the power dissipation of the ESD transistor. The ESD transistor initially breaks down at about 12 volts and snaps back quickly to a holding voltage of about 7-8 volts. The breakdown and holding voltages can be easily altered by simply choosing an appropriate channel length of the ESD protection transistor. For longer channel lengths, the voltages of the respective break points are higher, and vice versa.

Because the ESD transistor of the invention is of a similar structure, it can be masked and patterned in the same manner as the other transistors of the chip. Fabrication and masking, and the development of mask sets is therefore simplified. With a low holding voltage of 7-8 volts, the energy which must be dissipated within the thin semiconductor layer which overlies the insulator, is substantially reduced.

DESCRIPTION OF THE DRAWINGS

Further features and advantages will become apparent from the following and more particular description of the preferred embodiment of the invention, as illustrated in the accompanying drawings in which like reference characters generally refer to the same parts, regions or functions throughout the views, and in which.

DETAILED DESCRIPTION OF THE INVENTION

Figure 1:
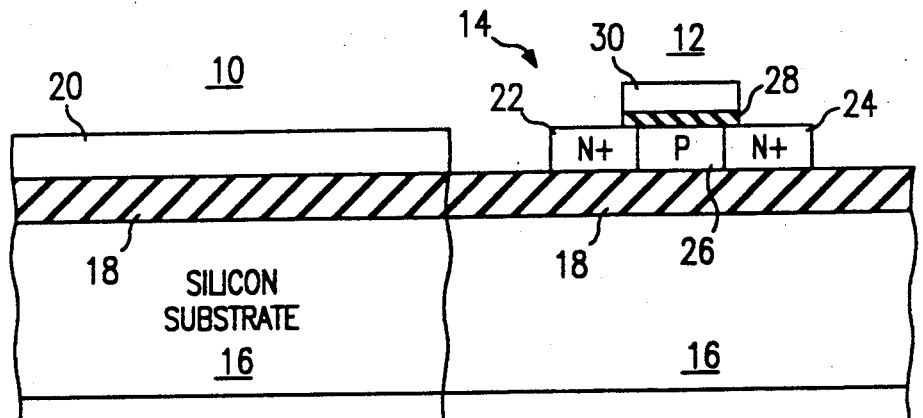
FIG. 1 is a cross-sectional view of a portion of a semiconductor-on-insulator structure, and an ESD transistor of the invention fabricated therefrom.

FIG. 1 illustrates a section 10 of a semiconductor-on-insulator chip, and another section 12 having an ESD protection transistor 14 fabricated therefrom. In accordance with the preferred embodiment of the invention, the section 10 includes a silicon substrate 16 which provides the physical support for the overlying transistor circuits. While not shown according to scale, the silicon substrate 16 is substantially thicker than either of an insulating layer 18 or a thin semiconductor layer 20 formed thereover.

The insulator 18 comprises silicon dioxide ($SiO_2$) formed by implanting a heavy dosage of oxygen atoms below the surface of the silicon substrate 16. As a result, a thin surface (not shown) is free of oxygen atoms. The silicon substrate 16 is then subjected to an annealing ambient, in which the sublayer of oxygen atoms is converted into an insulating silicon oxide layer of about one-half micron thickness. Defects in the thin layer of the silicon substrate material overlying the insulating layer 18 disappear after annealing and provide a suitable base for growing or depositing the thin epitaxial layer 20 of single crystal silicon material thereover. The epitaxial layer 20 is deposited to a thickness of about 0.3–1.0 microns and defines the semiconductor material in which the transistor circuits and devices of the chip are formed.

As noted above, the insulating layer 18 electrically isolates the circuit semiconductor layer 20 from the substrate 16, thereby reducing the capacitive coupling therebetween. As a result, the circuit speed of the devices formed in the semiconductor layer 20 is increased. Also as noted above, the insulating layer 18 exhibits poor thermal characteristics, and thus any heat generated within the thin semiconductor layer 20 is not coupled to the bulk of the substrate material 16. Thus, the thermal energy generated within the devices of the semiconductor layer 20 must be dissipated in such layer. While the semiconductor-on-insulator 10 shown in FIG. 1 is illustrated in connection with the preferred embodiment of the invention, it is to be understood that many other techniques and SOI structures can be employed for use with the present invention.

Section 12 of the SOI structure illustrates an ESD transistor of the invention. The ESD transistor 14 includes a heavily N+ doped semiconductor source region 22, a heavily N+ doped semiconductor drain region 24 and a lightly doped P-type semiconductor conduction channel 26. The semiconductor regions 22–26 are fabricated in a conventional manner by the appropriate masking, patterning and doping of the thin semiconductor layer 20, as shown in section 10 of the SOI structure. The ESD transistor includes a thin gate insulator 28 formed by the thermal growth of about 200 angstroms of silicon oxide. A doped polysilicon layer 30 functions as the gate conductor of the ESD transistor 14.

In the fabrication of the transistor 14, the thin semiconductor layer 20 is patterned to form a mesa or island, separate from the other transistors or devices on the chip. Importantly, the bulk material 26 of the conduction channel region of the transistor 14 is electrically isolated from the remaining semiconductor material 20 of the chip. The electrical isolation of the conduction channel bulk material 26 provides the ESD transistor 14 with unique characteristics which are especially well adapted for use in discharging electrostatic voltages with minimum power development within the device itself. While not shown, the semiconductor source region 22 and the semiconductor drain region 24 are provided with electrical contacts for connection to other chip circuit elements. In like manner, the gate conductor 30 is provided with a contact for connection to the semiconductor source region 22 to define a two-terminal device connectable between input or output pads and power or ground buses.

Figure 2:
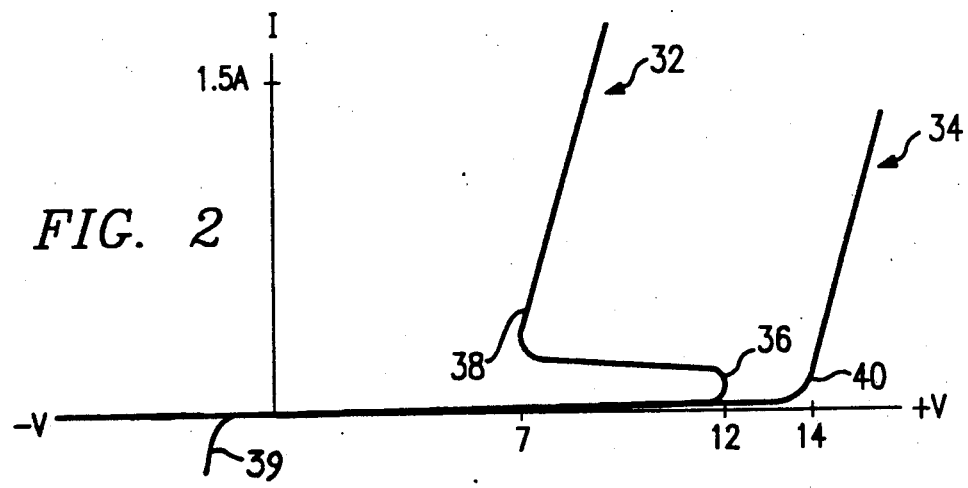
FIG. 2 illustrates the breakdown voltage characteristics of the ESD transistor of the invention.

FIG. 2 illustrates in diagrammatic form the breakdown voltage characteristics of the ESD transistor of the invention. The characteristic curves denote the breakdown voltage of the ESD transistor 14, with the gate conductor 30 connected to the semiconductor source region. In such a configuration, the semiconductor source region 22 would be connected to a chip ground bus, while the semiconductor drain region 24 would be connected to a conductor or bonding pad which is desired to be protected from damage by electrostatic discharge voltages. Also, the two-terminal device can be connected between an input or output bonding pad and a power supply bus to provide additional ESD protection to the cup circuits.

The curve 32 represents the breakdown voltage characteristics of the ESD transistor 14, while the curve 34 is shown for purposes of example for illustrating the electrical characteristics of a gated diode typically used for ESD protection. Also, curve 34 is substantially similar to the breakdown characteristics of a conventional N-channel FET transistor formed within the thin semiconductor layer 20, but with the bulk conduction channel material connected to a cotton bias voltage, as is common with such transistors.

When connected as noted above to function as an ESD transistor 14, the voltage across the transistor increases until it reaches a reverse breakdown voltage of about 12 volts, as noted by the break point 36 of the curve 32. At such point, the voltage across the ESD transistor 14 snaps back rapidly to a lower holding voltage, illustrated at about 7 volts. The ESD transistor 14 then maintains a relatively constant holding voltage across its two terminals, as illustrated by reference character 38. Due to the resistance of the two-terminal ESD transistor 14, with increased currents therethrough, the voltage generally linearly increases. When forward biased, the ESD transistor conducts at a threshold voltage ($V_t$) of about 1.0 volts. This is shown as waveform numeral 39. Typically, the ESD transistor 14 can carry upwardly of 1.5 amp, thereby providing the capability of discharging large electrostatic voltages.

Importantly, when carrying large electrostatic currents, the voltage across the ESD transistor 14 is 7–8 volts, or somewhat thereabove, which voltage is significantly less than the 12–14 volts of electrostatic protection devices heretofore utilized. As a result, with the lower voltage across the ESD transistor 14, less power is developed, and thus a correspondingly lower amount of heat is generated. This is especially important in SOI structures which have thin semiconductor layers which are not well adapted for dissipating large amounts of heat. Rather than being dissipated as heat, the electrostatic energy is transferred through the ESD transistor 14 as a larger current, which is carried back to the person or handler between the input pins and the ground or supply voltage buses.

The characteristics 32 of the ESD transistor 14 of the invention, as shown in FIG. 2, are attributable to the floating body or conduction channel of the transistor semiconductor region 26. When the body of the conduction channel 26 is not biased to a present voltage, the charge which is generated therein during operation raises the voltage of the floating body 26. With an increased voltage, above about 0.7 volts, the ESD transistor 14 enters conduction irrespective of the potential applied to the gate conductor 30, which conductor typically controls the transistor conduction. With the capability of fabricating extremely small transistors, the body 26 of the channel region can be made small and thus the amount of charge required to control conduction can be correspondingly small. It should be noted that floating body FET transistors have been previously utilized in conventional circuits, but have not been previously utilized advantageously for ESD protection purposes.

Curve 34 illustrates the characteristic curve of the gated diode previously employed for ESD protection in SIO structures. As noted, the characteristic curve 34 has a single break point 40 at about 14 volts. Once the gated diode enters a breakdown region, a voltage about 14 volts, or slightly greater, is developed across the device, which voltage causes a correspondingly larger power drop within the device.

Figure 3:
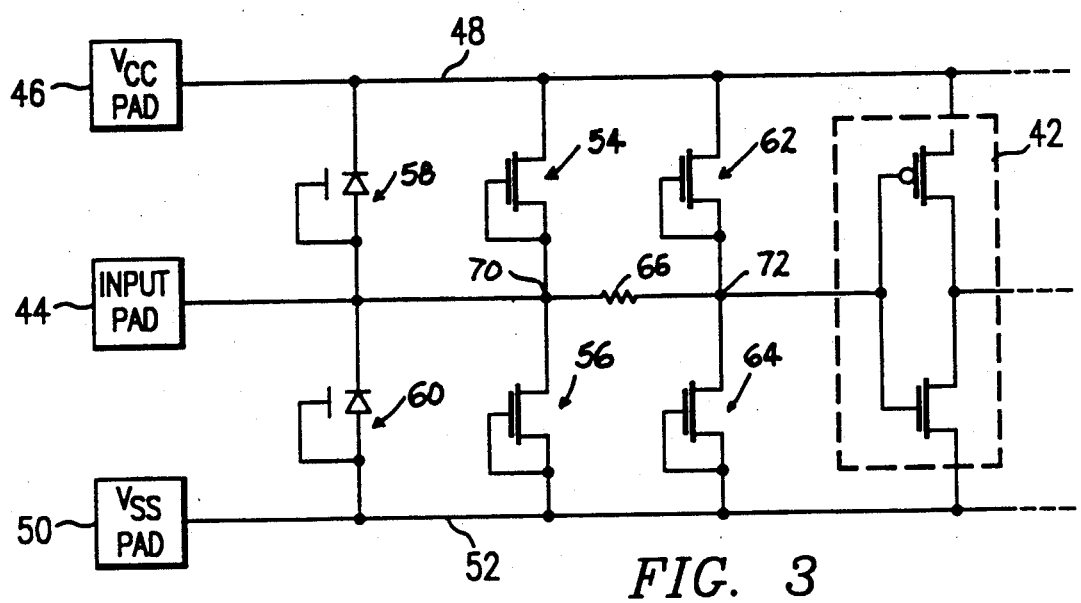
FIG. 3 illustrates an electrostatic discharge protection circuit constructed in accordance with the preferred embodiment of the invention.

FIG. 3 depicts an electrostatic protection circuit constructed according to the preferred embodiment of the invention. The circuit is shown integrated within a chip having a conventional circuit 42 connected to an input bonding pad 44 of the chip. The illustrated chip is shown having a supply voltage bonding pad 46 connected to a supply voltage conductor 48 for carrying DC voltages to the circuits of the chip. In like manner, a ground bonding pad 50 is connected to ground bus 52 for providing ground potentials to the various chip circuits. While the bonding pads 46 and 50 are illustrated for use with supply voltage and ground potentials, the ESD protection circuit of the invention can function with equal effectiveness with a number of different supply or signal voltages which are coupled to the chip.

The primary protection devices comprise a pair of floating body FET transistors 54 and 56. ESD transistor 54 has its drain connected to the supply voltage bus 48, and source and gate terminals shorted together and connected to the input pad 44 of the chip. In like manner, floating body ESD transistor 56 has its drain connected to the input pad 44, while its gate and source terminals are shorted together and connected to the ground bus 52. With ESD transistors 54 and 56 connected as shown in FIG. 3, adequate electrostatic discharge protection is provided to the circuit 42 of the chip. For example, if a positive electrostatic voltage was applied to the input pad 44, and if a conduction path were established via the ground pad 50, then protection transistor 56 would be reverse biased. As the electrostatic voltage rose beyond about 12 volts, the ESD transistor 56 would experience impact ionization and would break down, thereby conducting current therethrough from the input pad 44 to the ground pad 50. As the electrostatic voltage increased, a holding voltage would be established around 7-8 volts end thereby clamp the voltage at the input pad 44 to a value well below that which would otherwise destroy the chip circuit 42.

Because of the low holding voltage of the ESD transistor 56, the device experiences low thermal energy dissipation which is well suited for thin semiconductor layers which are typical of current SOI chips. In the event that an electrostatic conduction path were established between the input pad 44 and the ground pad 50, and of the voltage applied to the input pad 44 were negative, the protection transistor 56 would conduct when the forward voltage thereacross reached the threshold voltage ($V_t$) of the device. Typically, a threshold of such a transistor would be in the neighborhood of 1 volt, and thus the transistor 56 would protect the chip circuit 42 from electrostatic voltages, while yet developing very little power within the protection device 56 itself.

The foregoing ESD transistor operation would occur in an identical manner with protection transistor 54, when electrostatic voltage paths are established between the input pad 44 and the supply voltage pad 46. Hence, it should also be appreciated that the characteristics of the ESD circuit of the invention can be easily changed to accommodate various constraints required. For example, if it is desired to increase the current capability of either of the ESD Transistors 54 or 56, then the channel width of such devices can be simply decreased. For a channel width of about 500 microns, it is found that the ESD protection transistors 54 and 56 can each carry about 1.5 amp without damage to such devices or the circuit 42. Also, the breakdown knee 36 and the holding voltage 38 can be varied be changing the length of the conduction channel of the ESD transistors 54 and 56. For a breakdown voltage of about 12 volts and a holding voltage of about 7-8 volts, a channel length of about 3.6 microns is suitable.

While in the preferred embodiment of the invention, the channel width and length dimensions of the ESD protection transistors 54 and 56 are substantially equal, such a symmetry is not required. In the event that statistics show that positive ESD voltages are higher in magnitude than negative voltages than one of the other of the transistors 54 or 56 can be made with a larger channel to accommodate a corresponding larger current. The other of the transistors can then be made with a small channel width to thereby conserve wafer area.

Further refinements and improvements in the invention can be realized by the addition of conventional gated diodes 58 and 60. While the reverse breakdown voltage of such diodes 58 and 60 is greater than that of the ESD protection transistors 54 and 56 of the invention, such gated diodes do not conduct, when reversed biased and connected in parallel with the LSD transistors. However, the forward voltage of the gated diode 58 and 60 is on the order of about 0.7 volt and is somewhat lower than the forward threshold voltage of the ESD protection transistors 54 and 56. Hence, if an electrostatic conduction path is established between the input pad 44 and the ground pad 50 and if the voltage on the input pad 44 is negative with respect to the ground pad 50, the gated diode 60 will conduct before the ESD protection device 56 and protect the chip circuit 42 from overvoltages. Because the gated diode 60 conducts in a forward direction at a lower voltage than the ESD transistor 56, the power developed within the device 60, and thus that of the semiconductor layer, is reduced. The gated diode 58 operates in a similar manner in conjunction with the ESD protection device 54.

Yet further refinements and improvements can be accomplished or can be realized by the addition of a secondary pair of floating body ESD protection transistors 62 and 64. The common junction point of secondary protection transistors 62 and 64 is connected to the input pad 44 through a resistor 66. In the preferred form of the invention, the resistor is about 100 ohms. With this arrangement, and when considering positive voltages, the voltage at node 70 will always be greater than the voltage at node 72. One of the primary ESD protection transistors 54 or 56 will therefore commence conducting before the secondary ESD protection transistors 62 or 64. However, when secondary protection transistors 62 and 64 do conduct, such devices perform the same function in the same manner as primary protection transistors 54 and 56.

As noted above, and with regard to the graph of FIG. 2, when an ESD protection transistor of the invention commences conduction and exhibits a low holding voltage, such as shown by reference character 38, such holding voltage increases with increasing electrostatic currents. Therefore, if the electrostatic voltage applied to the input pad 44 has a long duration and a significant magnitude, it is possible that one of the primary protection transistors 54 or 56 turns off because the voltage thereacross exceeds the requisite 12 volt breakdown voltage. When this occurs, the secondary protection transistors 62 and 64 will become activated, albeit at a greater voltage because of the resistor 66, and continue protecting the chip circuit 42 from the electrostatic destruction. The resistor 66 does not substantially interfere with the normal operation of the chip circuit 42, as the signal level currents in MOS or CMOS circuits are very low. According, the voltage drop across resistor 66 due to signal currents is insubstantial.

Because of the construction, connection and operation of the ESD protection transistors and the gated diodes of the ESD protection circuit, the normal operation of the chip circuit 42 is not hampered. Hence, with normal operating signal voltages which are within the power supply ranges, the components of the ESD protection circuit will not be triggered and whereby interfere with the digital or analog operation of the chip.

From the foregoing, an improved electrostatic discharge protection device is disclosed which has the technical advantage of being easily implemented with current semiconductor-on-insulator type of circuits. An important technical advantage of the invention is that the ESD device is substantially similar in construction to the other transistors of the chip, and therefore such circuit can be easily fabricated. An additional technical advantage of the invention is that: the breakdown voltage and holding voltage parameters of the ESD protection device can be easily defined by selecting a desired channel length of the protection device. Yet another technical advantage of the invention is that the current carrying capability of the protection device can be selected according to the channel width of such device.

Although the preferred embodiment of the invention has been described in detail, it should be understood that various changes, substitutions and alterations can be made herein without departing from the spirit and scope of the invention, as defined by the appended claims.

What is claimed is:

1. An ESD protection device for use with semiconductor-on-insulator circuits, comprising:
   a semiconductor-on-insulator structure including a semiconductor material adapted for forming transistors therein;
   a conductor for carrying signals with respect to said transistor circuits; and
   a field effect transistor connected to said conductor for carrying ESD currents, said transistor having a semiconductor body defining a conduction channel between a semiconductor drain and a semiconductor source, said semiconductor body being electrically isolated from other semiconductor bodies formed from the semiconductor-on-insulator structure.

2. The ESD protection device of claim 1, wherein said transistor has one of said source or drain connected in common with a gate conductor of said transistor to define a two-terminal device.

3. The ESD protection device of claim 2, wherein said transistor exhibits a breakdown voltage characteristic having a reverse breakdown point and a holding voltage which is lower than said break point.

4. The ESD protection device of claim 3, wherein said transistor has a breakdown voltage characteristic which is a function of conduction channel length between said source and drain.

5. The ESD protection device of claim 3, wherein said breakdown point is about 12 volts, and said holding voltage is greater than about 7 volts.

6. The ESD protection device of claim 1, wherein said transistor comprise: an N-channel field effect transistor.

7. The ESD protection device of claim 1, further including a pair said transistors, each connected to said conductor, and further including a supply voltage conductor connected to one said transistor, and a ground conductor connected to the other said transistor.

8. The ESD protection device of claim 7, further including a pair of gated diode devices to provide a low forward voltage characteristic to an ESD protection circuit formed thereby.

9. The ESD protection device of claim 8, wherein said pair of transistors defines a primary protection circuit, and further including a second pair of said transistors connected in parallel to said primary protection circuit, and a resistor connecting said primary protection circuit to said second pair of transistors.

10. A transistor for providing ESD protection to a semiconductor-on-insulator circuit, comprising:
    a field effect transistor having a semiconductor body defining a conduction channel between a semiconductor source region and a semiconductor drain region, said semiconductor body being electrically isolated from other transistor semiconductor bodies of the semiconductor-on-insulator circuit
    means connecting together one of said source or drain regions to a gate conductor of said field effect transistor; and
    said transistor exhibiting an electrical characteristic having a reverse breakdown voltage and a holding voltage which is substantially lower than said breakdown voltage to thereby minimize power consumption of said field effect transistor.

11. The transistor of claim 10, wherein said field effect transistor comprises an N-channel transistor.

12. The transistor of claim 10, wherein said transistor has a reverse breakdown voltage less than about 14 volts.

13. The transistor of claim 10, further including in combination a gated diode connected in parallel to said transistor, and wherein said transistor has a lower reverse breakdown voltage than that of said gated diode.

14. The transistor of claim 11, wherein said gated diode is characterized with a lower forward conducting voltage than that of said transistor.

15. The transistor of claim 10, wherein the semiconductor body of said transistor is adapted to change a characteristic voltage thereof in response to an accumulation of charge therein.

16. The transistor cf claim 13, wherein said transistor comprises a floating body device.

17. An electrostatic discharge protection circuit, comprising:
   a power supply bonding pad and an associated power supply bus;
   a ground bonding pad and an associated ground bus;
   a signal bonding pad and an associated signal bus;
   a first and second gated diode connected to said signal bus and respectively to said power supply bus and said ground bus;
   a first and second floating body transistor defining a primary protection circuit connected to said signal bus and respectively to said power supply bus and said ground bus;
   a first and second floating body transistor defining a secondary protection circuit connected to said signal bus and respectively to said power supply bus and said ground bus; and
   a resistor connecting said primary protection circuit to said secondary protection circuit.

18. The circuit of claim 17, wherein said primary and secondary protection circuits comprise N-channel field effect transistors each having a breakdown voltage and a lower holding voltage.

19. The circuit of claim 17, wherein said primary and secondary protection circuits comprise field effect transistors each configured as a two-terminal device.

20. The circuit of claim 19, wherein said transistors each have a gate terminal connected to a source terminal.

* * * * *